United States Patent
Suh et al.

(10) Patent No.: US 8,592,677 B2
(45) Date of Patent: Nov. 26, 2013

(54) SUBSTRATE, SOLAR CELL INCLUDING THE SUBSTRATE, AND METHOD OF MANUFACTURING THE SAME

(75) Inventors: Myoung Gyun Suh, Seoul (KR); Dong Ho Kim, Seoul (KR); Ji Eun Chang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 142 days.

(21) Appl. No.: 13/034,894

(22) Filed: Feb. 25, 2011

(65) Prior Publication Data

US 2012/0080084 A1    Apr. 5, 2012

(30) Foreign Application Priority Data

Oct. 4, 2010    (KR) .................. 10-2010-0096384

(51) Int. Cl.
*H01L 31/0216*    (2006.01)
*H01L 31/0264*    (2006.01)
*H01L 31/18*    (2006.01)

(52) U.S. Cl.
USPC ........... 136/256; 136/261; 136/262; 136/252; 438/93; 257/189; 257/442; 257/E31.019

(58) Field of Classification Search
USPC ................. 136/256, 261, 262, 252; 438/93; 257/189, 442, E31.019
See application file for complete search history.

(56) References Cited

U.S. PATENT DOCUMENTS

| 6,387,780 | B1 | 5/2002 | Nishida |
| 7,198,973 | B2 | 4/2007 | Lin et al. |
| 2008/0251121 | A1 | 10/2008 | Stone |
| 2010/0012184 | A1 | 1/2010 | Naya et al. |
| 2010/0078056 | A1 | 4/2010 | Hovel |

FOREIGN PATENT DOCUMENTS

| JP | 01266716 A | 10/1989 |
| JP | 07045846 A | 2/1995 |
| JP | 07-201748 A | 8/1995 |
| JP | 07-273029 A | 10/1995 |
| JP | 09-260232 A | 10/1997 |
| JP | 2002141327 A | 5/2002 |
| JP | 2002368244 A | 12/2002 |
| JP | 2009088098 A | 4/2009 |
| JP | 2010027794 A | 2/2010 |
| KR | 1019980024745 A | 7/1998 |
| KR | 1020090129507 A | 12/2009 |

OTHER PUBLICATIONS

Yamaichi et al, JP 07-045846 A online machine translation as provided by The Industrial Property Digital Library (IPDL) (http://www19.ipdl.inpit.go.jp/PA1/cgi-bin/PA1INDEX), translated on Oct. 20, 2012.*

* cited by examiner

*Primary Examiner* — Golam Mowla
(74) *Attorney, Agent, or Firm* — Cantor Colburn LLP

(57) ABSTRACT

A substrate includes a semiconductor layer, a plurality of dielectric layers disposed on one side of the semiconductor layer and separated from each other and a photoactive layer disposed between the dielectric layers and including a compound of a Group III element and a Group V element. Also disclosed are a solar cell including the same and a manufacturing method thereof.

28 Claims, 12 Drawing Sheets

SUBSTRATE, SOLAR CELL INCLUDING THE SUBSTRATE, AND METHOD OF MANUFACTURING THE SAME

CROSS-REFERENCE TO RELATED APPLICATIONS

This application claims priority to Korean Patent Application No. 10-2010-0096384, filed on Oct. 4, 2010, and all the benefits accruing therefrom under 35 U.S.C. §119, the content of which in its entirety is herein incorporated by reference.

BACKGROUND

1) Field

This disclosure relates to a substrate, a solar cell including the substrate and a method of manufacturing the same.

2) Description of the Related Art

A solar cell transforms solar energy into electrical energy. Typically, solar cells are diodes formed of PN junctions and they are divided into diverse types according to a material used in a photoactive layer.

Some types of solar cells are a silicon solar cell, which includes silicon as a photoactive layer, a compound thin film solar cell, which includes $CuInGaSe_2$ ("CIGS"), $CuInSe_2$ ("CIS") or $CuGaSe_2$ ("CGS") as a photoactive layer, a Group III-V solar cell, a dye-sensitive solar cell and an organic solar cell.

Currently, much research into improvement of efficiency and productivity of solar cells is being actively undertaken.

SUMMARY

One aspect of this disclosure provides a substrate capable of decreasing strain and defects of a photoactive layer and a solar cell including the substrate.

Another aspect of this disclosure provides a method for manufacturing the substrate and the solar cell.

According to one aspect of this disclosure, a substrate is provided that includes a semiconductor layer, a plurality of dielectric layers disposed on one side of the semiconductor layer and separated from each other and a photoactive layer disposed between the dielectric layers and including a compound of a Group III element and a Group V element.

In an embodiment, the semiconductor layer may at least include Si, Ge and a combination thereof. In an embodiment, the semiconductor layer may include Si.

In an embodiment, the dielectric layers may include at least an oxide, a nitride, an oxynitride, and a combination thereof, wherein the oxide may include at least aluminum oxide ($Al_2O_3$), silicon oxide ($SiO_x$), titanium oxide ($TiO_2$ or $TiO_4$), and a combination thereof, the nitride may include at least aluminum nitride (AlN), silicon nitride ($SiN_x$), titanium nitride (TiN), and a combination thereof, and the oxynitride may include at least aluminum oxynitride (AlON), silicon oxynitride (SiON), titanium oxynitride (TiON), and a combination thereof.

In an embodiment, a distance between the dielectric layers may be from about 1 millimeter (mm) to about 10 mm, a thickness of the dielectric layers may be from about 1 micrometer (μm) to about 20 μm and a width of the dielectric layers may be from about 1 μm to about 200 μm.

In an embodiment, the photoactive layer may include a compound of a Group III element and a Group V element, wherein the Group III element may include at least B, Al, Ga, In, Tl and a combination thereof, and the Group V element may include at least N, P, As, Sb, Bi and a combination thereof.

In an embodiment, a thickness of the photoactive layer may be equal to or less than a thickness of the dielectric layer of the plurality of dielectric layers.

In an embodiment, the substrate may further include at least one of auxiliary layers formed on the one side of the semiconductor layer and covered with the photoactive layer.

In an embodiment, the auxiliary layer may include at least an oxide, a nitride, an oxynitride, and a combination thereof, and the oxide, the nitride, and the oxynitride are as described above.

In an embodiment, two or more auxiliary layers are included and a distance between the auxiliary layers may be from about 10 nanometers (nm) to about 1 μm, a thickness of the auxiliary layers may be from about 1 nm to about 100 nm, and a width may the auxiliary layers be from about 1 nm to about 100 nm and the auxiliary layers are separated from each other.

According to another aspect of this disclosure, a method for manufacturing a substrate is provided that includes forming a semiconductor layer, forming a plurality of dielectric layers separated from each other on one side of the semiconductor layer and forming a photoactive layer including a compound of a Group III element and a Group V element between the dielectric layers.

In an embodiment, the forming of a plurality of dielectric layers may include applying a dielectric material on the one side of the semiconductor layer and patterning the applied dielectric material.

In an embodiment, the dielectric layers may be formed such that a distance therebetween may be from about 1 mm to 10 mm, a thickness may be from about 1 μm to 20 μm and a width may be from about 1 μm to 200 μm.

In an embodiment, the photoactive layer may be formed such that a thickness of the photoactive layer may be equal to or less than a thickness of the dielectric layer of the plurality of dielectric layers.

In an embodiment, the method may further include forming at least two of auxiliary layers separated from each other between the dielectric layers, before forming the photoactive layer, and one of the auxiliary layers may be formed such that a thickness thereof may be less than a thickness of the dielectric layer.

According to yet another aspect of this disclosure, a solar cell is provided that includes a semiconductor layer, a plurality of dielectric layers disposed on one side of the semiconductor layer and separated from each other, a photoactive layer disposed between the dielectric layers and including a compound of a Group III element and a Group V element, a first electrode electrically connected to the semiconductor layer and a second electrode electrically connected to the photoactive layer.

In an embodiment, the semiconductor layer, the dielectric layer, the Group III element, the Group V element and the photoactive layer are as described above.

In an embodiment, the second electrode may be disposed at least on one side of the dielectric layer, on one side of the photoactive layer or on both.

In an embodiment, when the second electrode is disposed on the one side of the dielectric layer, a width of the second electrode may be larger than a width of the dielectric layer of the plurality of dielectric layers.

In an embodiment, the solar cell may further include at least two of auxiliary layers formed between the dielectric layers, covered with the photoactive layer and separated from each other. The auxiliary layer is as described above.

In an embodiment, the solar cell may be divided into a plurality of unit cells.

According to yet another aspect of this disclosure, a method for manufacturing a solar cell is provided that includes forming a semiconductor layer, forming a plurality of dielectric layers separated from each other on one side of the semiconductor layer, forming a photoactive layer including a compound of Group III element and a Group V element between the dielectric layers, forming a first electrode electrically connected to the semiconductor layer and forming a second electrode electrically connected to the photoactive layer.

In an embodiment, the forming of a plurality of dielectric layers and the formed dielectric layers are as described above.

In an embodiment, the photoactive layer may be formed such that a thickness of the photoactive layer may be equal to or less than a thickness of the dielectric layer of the plurality of dielectric layers.

In an embodiment, the second electrode may be disposed at least on one side of the dielectric layer of the plurality of dielectric layers, on one side of the photoactive layer or on both.

In an embodiment, when the second electrode is disposed on the one side of the photoactive layer, the method may further include cutting the dielectric layer of the plurality of dielectric layers, the semiconductor layer and the first electrode along a vertical direction of the dielectric layer of plurality of dielectric layers, after disposing the second electrode.

In an embodiment, the method may further include forming at least two of auxiliary layers separated from each other between the dielectric layers, before the forming of the photoactive layer and the auxiliary layers may be formed such that a thickness of each auxiliary layer may be less than a thickness of the dielectric layer of the plurality of dielectric layers.

Other aspects of this disclosure will be described in the following detailed description.

BRIEF DESCRIPTION OF THE DRAWINGS

The above and other aspects, advantages and features of this disclosure will become more apparent by describing in further detail embodiments thereof with reference to the accompanying drawings, in which.

DETAILED DESCRIPTION

Figure 1:
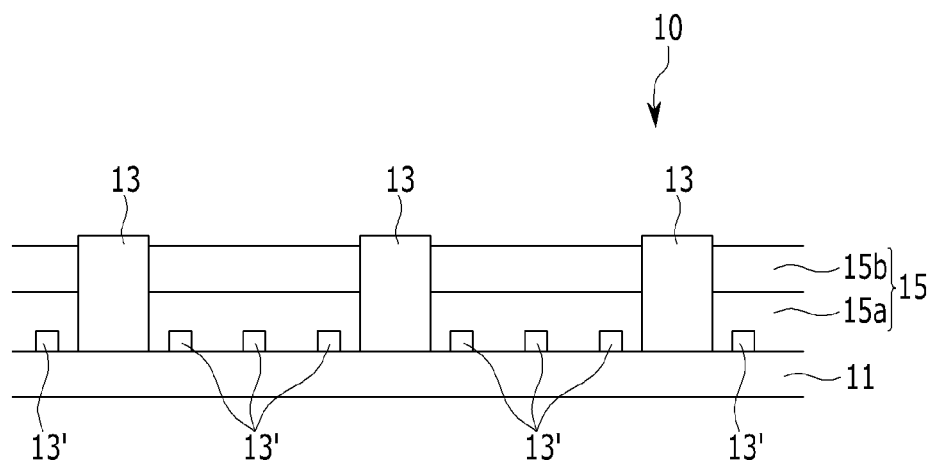
FIG. 1 is a cross-sectional view of an embodiment of a substrate.

Embodiments now will be described more fully hereinafter with reference to the accompanying drawings, in which embodiments of the invention are shown. The embodiments may, however, be embodied in many different forms and should not be construed as limited to the embodiments set forth herein. Rather, these embodiments are provided such that this disclosure will be thorough and complete and will fully convey the scope of the invention to those skilled in the art.

In the drawings, the thickness of layers, films, panels, regions, etc., are exaggerated for clarity. Like reference numerals refer to like elements throughout the specification. It will be understood that when an element such as a layer, film or substrate is referred to as being "on" another element, it may be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the terms "a" and "an" are open terms that may be used in conjunction with singular items or with plural items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

According to one embodiment, the substrate includes a semiconductor layer, a plurality of dielectric layers disposed on one side of the semiconductor layer and separated from each other and a photoactive layer disposed between the dielectric layers and including a compound of a Group III element and a Group V element. Hereinafter, the substrate according to one embodiment is described in detail referring to FIG. 1.

FIG. 1 is a cross-sectional view of an embodiment of a substrate.

Hereinafter, a term "front side" refers to the side receiving solar energy and a term "rear side" refers to the side opposite to the front side. In addition, for better understanding and ease of description, the upper and lower positional relationship is described with respect to a semiconductor layer 11, but is not limited thereto.

A substrate 10 includes a semiconductor layer 11.

The semiconductor layer 11 may include Si, Ge or a combination thereof. In an embodiment, the semiconductor layer includes Si. The semiconductor layer 11 is light and resistant to radiation and mechanical impact and thus may be formed thin with a large area. If the semiconductor layer 11 is used in a solar cell, then mechanical properties of the solar cell may be improved and output per unit area may be improved.

Although the semiconductor layer 11 doped with a p-type impurity is shown in FIG. 1, a semiconductor layer doped with an n-type impurity may also be used. The p-type impurity may include a Group III compound, such as boron (B) and aluminum (Al), and the n-type impurity may include a Group V compound, such as phosphorus (P).

If the semiconductor layer 11 is doped with the p-type impurity, then holes separated from a photoactive layer may be effectively collected at the electrode. Further, if the semiconductor layer 11 is doped with an n-type impurity, then electrons separated from the photoactive layer may be effectively collected at the electrode.

A plurality of dielectric layers 13 that are separated from each other is disposed on a front side of the semiconductor layer 11.

The structure of the dielectric layer 13 determines the width of a photoactive layer 15 to be disposed, thus substantially relieving or effectively preventing strain generation in the photoactive layer 15. The structure of the dielectric layer 13 may also effectively prevent an increase in a number of defects when increasing a dimension of the photoactive layer 15, thus substantially relieving or effectively preventing defect formation in the photoactive layer 15, particularly on the surface of the photoactive layer 15. In addition, if a solar cell includes the dielectric layer 13, then the solar cell may be separated into various unit cells without substantially damaging the photoactive layer 15.

The dielectric layer 13 may include an oxide, a nitride, an oxynitride or a combination thereof. In an embodiment, the oxide may include aluminum oxide ($Al_2O_3$), silicon oxide ($SiO_x$), titanium oxide ($TiO_2$ or $TiO_4$) or a combination thereof, but is not limited thereto. The nitride may include aluminum nitride (AlN), silicon nitride ($SiN_x$), titanium nitride (TiN) or a combination thereof, but is not limited thereto. The oxynitride may include aluminum oxynitride (AlON), silicon oxynitride (SiON), titanium oxynitride (TiON) or a combination thereof, but is not limited thereto.

The distance between the dielectric layers 13 may be about 1 millimeter (mm) to about 10 mm. If a distance between the dielectric layers 13 is within the above range, then strain generation in the photoactive layer 15 may be effectively prevented or substantially relieved.

The dielectric layer 13 may have a thickness of about 1 micrometer (μm) to about 20 μm. If a thickness of the dielectric layer 13 is within the above range, then the photoactive layer 15 may be easily disposed. The thickness of the dielectric layer 13 is measured along a direction substantially perpendicular to a surface of the semiconductor layer 11. Further, in an embodiment, photoactive layers 15 existing symmetrically to each other with respect to the dielectric layer 13 may be easily separated mechanically and electrically.

The dielectric layer 13 may have a width of about 1 μm to about 200 μm. If a width of the dielectric layer 13 is within the above range, then a solar cell including the dielectric layer 13 may be effectively separated into unit cells without substantially damaging the photoactive layer 15. The width of the dielectric layer 13 is measured along a direction substantially parallel to the surface of the semiconductor layer 11.

The photoactive layer 15 includes a lower photoactive layer 15a and an upper photoactive layer 15b. The photoactive layer 15 is disposed between the dielectric layers 13 that are separated from each other. The photoactive layer 15 may include a compound of a Group III element and a compound of a Group V element. Group III includes elements such as boron (B), aluminum (Al), gallium (Ga), indium (In), thallium (Tl) or a combination thereof. Group V includes elements such as nitrogen (N), phosphorous (P), arsenic (As), antimony (Sb), bismuth (Bi) or a combination thereof.

One of the lower photoactive layer 15a and the upper photoactive layer 15b may be doped with a p-type impurity and the other may be doped with an n-type impurity. The p-type impurity may include a Group II b compound, such as zinc (Zn) and cadmium (Cd) and a Group III compound, such boron (B), or a combination thereof. The n-type impurity may include a Group IV compound, such as silicon (Si) and a Group VI compound, such as selenium (Se) and tellurium (Te), or a combination thereof.

Although the lower photoactive layer 15a doped with a p-type impurity and the upper photoactive layer 15b doped with an n-type impurity are shown in FIG. 1, the lower photoactive layer 15a may be doped with an n-type impurity and the upper photoactive layer 15b may be doped with a p-type impurity.

The thickness of the photoactive layer 15 may be equal to or less than the thickness of the dielectric layer 13. The thickness of the photoactive layer 15 is measured along the direction substantially perpendicular to the surface of the semiconductor layer 11. Thus, strain generation in the photoactive layer 15 may be effectively prevented or substantially relieved. Further, when a solar cell including the dielectric layer 13 is separated into unit cells by vertically cutting the dielectric layer 13, the solar cell may be effectively separated without substantially damaging the photoactive layer 15.

The substrate 10 may further include at least one of auxiliary layers 13' disposed on one side of the semiconductor layer 11. In an embodiment, auxiliary layers 13' are covered with the photoactive layer 15 and are separated from each other. Although many auxiliary layers 13' are shown in FIG. 1, an embodiment of the substrate 10 may not include the auxiliary layers 13'.

If the substrate 10 includes the auxiliary layers 13', then an increase in a number of defects may be effectively prevented when increasing the dimension of the photoactive layer 15. The inclusion of the auxiliary layers 13' thus effectively prevents or substantially relieves defect formation in the photoactive layer 15, particularly on the surface of the photoactive layer 15. The inclusion of the auxiliary layers 13' further effectively prevents or substantially relieves strain generation in the photoactive layer 15.

The auxiliary layer 13' may include an oxide, a nitride, an oxynitride or a combination thereof. Hereinafter, unless otherwise indicated, the oxide, the nitride and the oxynitride are as described above.

The distance between the auxiliary layers 13' may be about 10 nanometers (nm) to about 1 μm. If a distance between the auxiliary layers 13' is within the above range, then defect formation in the photoactive layer 15 may be effectively prevented or substantially relieved when disposing the photoactive layer 15.

A thickness of the auxiliary layer 13' is less than the thickness of the dielectric layer 13 and the thickness of the auxiliary layer 13' may be about 1 nm to about 100 nm. The thickness of the auxiliary layer 13' is measured along the direction substantially perpendicular to the surface of the semiconductor layer 11. If a thickness of the auxiliary layer 13' is within the above range, then defect formation in the photoactive layer 15 may be effectively prevented or substantially relieved when disposing the photoactive layer 15.

The auxiliary layer 13' may have a width of about 1 nm to about 100 nm. The width of the auxiliary layer 13' is measured along the direction substantially parallel to the surface of the semiconductor layer 11. If a width of the auxiliary layer 13' is within the above range, then, when disposing the photoactive layer 15, defect formation in the photoactive layer 15 may be effectively prevented or substantially relieved.

An embodiment of a method for manufacturing a substrate includes forming a semiconductor layer, forming a plurality of dielectric layers separated from each other on one side of the semiconductor layer and forming a photoactive layer including a compound of a Group III element and a Group V element between the dielectric layers. Referring to FIGS. 2A to 2D together with FIG. 1, an embodiment of a manufacturing method of a substrate is described in detail referring to FIGS. 2A to 2D together with FIG. 1.

FIGS. 2A to 2D are cross-sectional views sequentially showing an embodiment of a manufacturing method of a substrate.

Figure 2A:
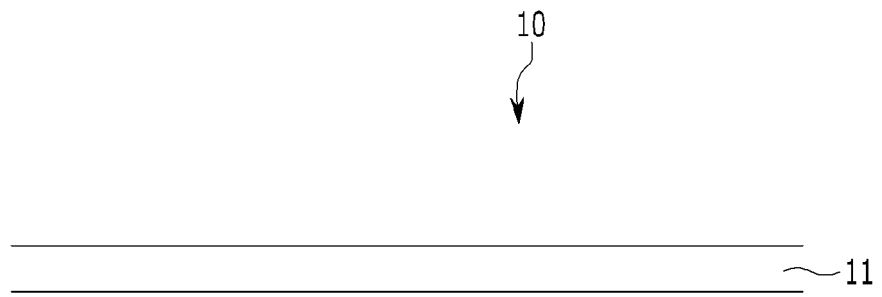
FIGS. 2A to 2D are cross-sectional views sequentially showing an embodiment of a manufacturing method of the substrate.

First, referring to FIG. 2A, a semiconductor layer 11 is formed. The semiconductor layer 11 may be formed as a silicon wafer. The semiconductor layer 11 may be doped with, for example, a p-type impurity, or doped with an n-type impurity.

Figure 2B:
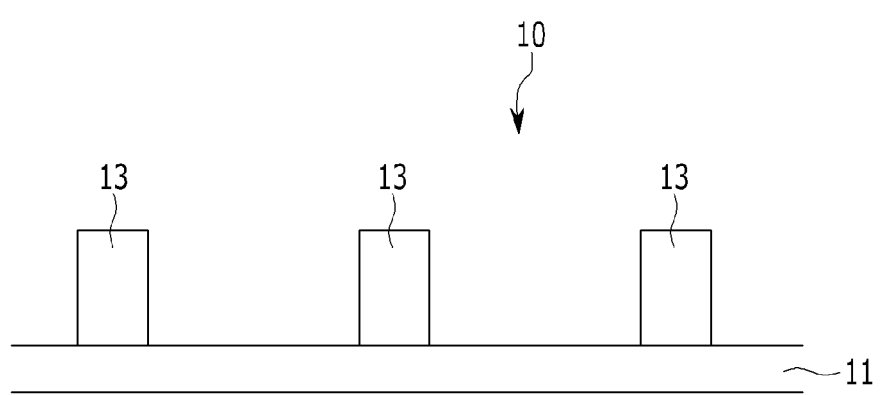

Next, referring to FIG. 2B, a patterned dielectric layer 13 is formed on a front side of the semiconductor layer 11. The patterned dielectric layer 13 may be formed on the front side of the semiconductor layer 11 by applying, for example, silicon nitride by Plasma Enhanced Chemical Vapor Deposition ("PECVD") and then etching using a photoresist to pattern the dielectric layer 13, or by screen printing, inkjet printing, press printing or a combination thereof, but not limited thereto.

The dielectric layers 13 may be formed so as to have a distance therebetween of about 1 mm to about 10 mm, a thickness of about 1 μm to about 20 μm and a width of about 1 μm to about 200 μm.

Figure 2C:
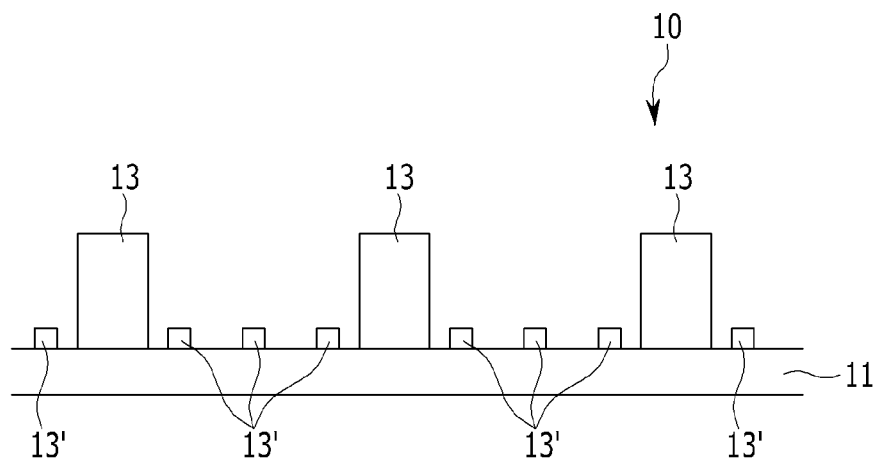

Next, referring to FIG. 2C, a patterned auxiliary layer 13' distinguished from the dielectric layer 13 is formed on the front side of the semiconductor layer 11. The patterned auxiliary layer 13' may be formed similarly to the patterned dielectric layer 13. Although a process for forming the patterned auxiliary layer 13' is shown in FIG. 2C, in an embodiment, the process may be omitted.

The auxiliary layer 13' may be formed such that the thickness of the auxiliary layer 13' may be less than the thickness of the dielectric layer 13.

Figure 2D:
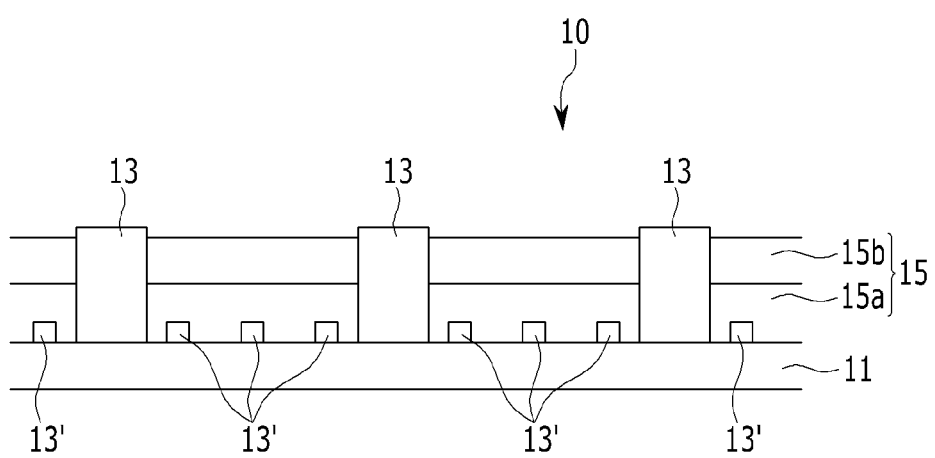

Next, referring to FIG. 2D, a photoactive layer 15 is formed between the dielectric layers 13 so as to cover the auxiliary layer 13'.

In an embodiment, by sequentially growing Zn-doped GaAs and Si-doped GaAs by a Metal-Organic Vapor Phase Epitaxy ("MOVPE"), a Molecular Beam Epitaxy ("MBE"), or a Chemical Beam Epitaxy ("CBE"), the photoactive layer 15 including a lower photoactive layer 15a doped with a p-type impurity and an upper photoactive layer 15b doped with an n-type impurity may be formed. However, the lower photoactive layer 15a may be doped with an n-type impurity and the upper photoactive layer 15b may be doped with a p-type impurity.

The photoactive layer 15 may be formed such that the thickness of the photoactive layer 15 may be equal to or less than the thickness of the dielectric layer 13.

As previously described, if a plurality of dielectric layers 13 are formed on the front side of the semiconductor layer 11 and then the photoactive layer 15 is formed between the dielectric layers 13, then defect and strain generation in the photoactive layer 15 may be effectively prevented or substantially relieved.

An embodiment of a solar cell includes a semiconductor layer, a plurality of dielectric layers disposed on one side of the semiconductor layer and separated from each other, a photoactive layer disposed between the dielectric layers and including a compound of a Group III element and a Group V element, a first electrode electrically connected to the semiconductor layer and a second electrode electrically connected to the photoactive layer.

The second electrode may be disposed on one side of the dielectric layer, on one side of the photoactive layer or on both.

The structure of the solar cell may determine the width of a photoactive layer to be disposed by inclusion of the dielectric layer, thus effectively preventing or substantially relieving strain generation in the photoactive layer. Further, when dimensions of the photoactive layer are increased and the photoactive layer is disposed, then an increase in the number of defects may be substantially blocked to effectively prevent or substantially relieve defect formation in the photoactive layer, particularly on the surface of the photoactive layer.

An embodiment of a manufacturing method of a solar cell includes forming a semiconductor layer, forming a plurality of dielectric layers separated from each other on one side of the semiconductor layer, forming a photoactive layer including a compound of a Group III element and a Group V element between the dielectric layers, disposing a first electrode electrically connected to the semiconductor layer and disposing a second electrode electrically connected to the photoactive layer.

Figure 3A:
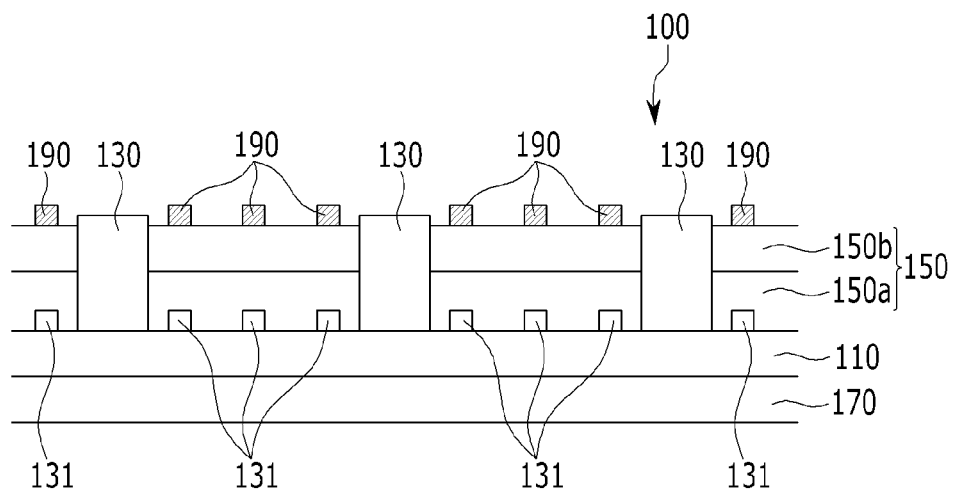
FIG. 3A is a cross-sectional view of an embodiment of a solar cell.

Referring to FIG. 3A, an embodiment of a solar cell is described. FIG. 3A is a cross-sectional view of an embodiment of a solar cell.

A solar cell 100 includes a semiconductor layer 110. Hereinafter, unless otherwise indicated, the semiconductor layer 110 is as described above.

On a front side of the semiconductor layer 110, a plurality of dielectric layers 130 separated from each other are disposed. Hereinafter, unless otherwise indicated, the dielectric layers 130 are as described above.

The distance between the dielectric layers 130 may be about 1 mm to about 10 mm. If the distance between the dielectric layers 130 is within the above range, then strain generation in the photoactive layer 150 may be effectively prevented or substantially relieved. In an embodiment, the distance between the dielectric layers 130 may be about 1 mm to about 7 mm. In an embodiment, the distance between the dielectric layers 130 may be about 3 mm to about 7 mm.

The dielectric layer 130 may have a thickness of about 1 μm to about 20 μm. If the thickness of the dielectric layer 130 is within the above range, then the photoactive layer 150 may be easily disposed. Further, in an embodiment, photoactive layers 150 existing symmetrically to each other with respect to the dielectric layer 130 may be easily separated mechanically and electrically.

The dielectric layer 130 may have a width of about 1 μm to about 200 μm. If the width of the dielectric layer 130 is within the above range, then the solar cell 100 may be effectively separated into unit cells without substantially damaging the photoactive layer 150. In an embodiment, the dielectric layer 130 may have a width of about 10 μm to about 200 μm. In another embodiment, the dielectric layer 130 may have a width of about 10 μm to about 100 μm. In yet another embodiment, the dielectric layer 130 may have a width of about 30 μm to about 100 μm.

The photoactive layer 150 including a lower photoactive layer 150a and an upper photoactive layer 150b is disposed between the dielectric layers 130 that are separated from each other. Hereinafter, unless otherwise indicated, the photoactive layer 150, the lower photoactive layer 150a and the upper photoactive layer 150b are as described above.

A front electrode 190 is disposed on the photoactive layer 150. In an embodiment, a plurality of front electrodes 190 that are separated from each other may be disposed on one photoactive layer 150.

The front electrode 190 may be made of a low resistance metal, such as molybdenum (Mo), aluminum (Al), silver (Ag), gold (Au), platinum (Pt), nickel (Ni) and copper (Cu). The front electrode 190 may be designed in a grid pattern considering shadowing loss and sheet resistance.

In an embodiment, the front electrode 190 may include a transparent conductive material that transmits solar light and has conductivity. The transparent conductive material may include a transparent conductive oxide ("TCO"), such as ZnO:Al, ZnO:B, $SnO_2$, $SnO_2$:F or indium tin oxide ("ITO"), which often effectively prevents deterioration of light transmittance and has low resistivity and good surface roughness.

A rear electrode 170 is disposed under the semiconductor layer 110.

The rear electrode 170 may reflect light passing through the semiconductor layer 110 back to the semiconductor layer 110, thereby effectively preventing light loss to increase solar cell efficiency.

The rear electrode 170 may be made of, for example, molybdenum (Mo), aluminum (Al), silver (Ag), gold (Au), platinum (Pt), nickel (Ni), copper (Cu) or a combination thereof.

The solar cell 100 may further include at least one of auxiliary layers 131 disposed on one side of the semiconductor layer, covered with the photoactive layer 150 and separated from each other. Although the auxiliary layers 131 are shown in FIG. 3A, an embodiment of the solar cell 100 may not include the auxiliary layers 131. Hereinafter, unless otherwise indicated, the auxiliary layers 131 are as described above.

The distance between the auxiliary layers 131 may be about 10 nm to about 1 μm. If the distance between the auxiliary layers 131 is within the above range, then defect formation in the photoactive layer 150 may be effectively prevented or substantially relieved when disposing the photoactive layer 150. In an embodiment, the distance between the auxiliary layers 131 may be about 100 nm to about 1 μm.

The thickness of the auxiliary layer 131 is less than the thickness of the dielectric layer 130. The thickness of the auxiliary layer 131 may be about 1 nm to about 100 nm. If the thickness of the auxiliary layer 131 is within the above range, then, when disposing the photoactive layer 150, defect formation in the photoactive layer 150 may be effectively prevented or substantially relieved. In an embodiment, the auxiliary layer 131 may have a thickness of about 10 nm to about 100 nm.

The auxiliary layer 131 may have a width of about 1 nm to about 100 nm. If the width of the auxiliary layer 131 is within the above range, then, when disposing the photoactive layer 150, defect formation in the photoactive layer 150 may be effectively prevented or substantially relieved. In an embodiment, the auxiliary layer 131 may have a width of about 10 nm to about 100 nm.

Figure 3B:
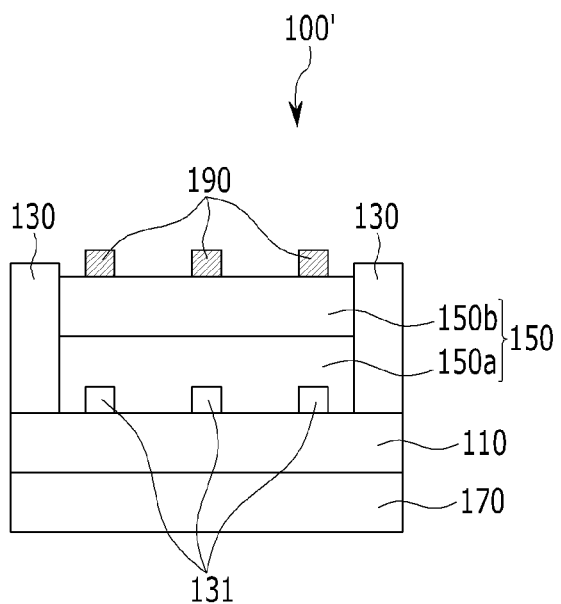
FIG. 3B is a cross-sectional view of an embodiment of a unit cell of the solar cell.

The solar cell 100 may be separated into a plurality of unit cells 100' by cutting the dielectric layer 130, the semiconductor layer 110 and the rear electrode 170 along the vertical direction of the dielectric layer 130. FIG. 3B is a cross-sectional view of an embodiment of a unit cell 100' of the separated solar cell.

Referring to FIGS. 4A to 4G together with FIG. 3A and FIG. 3B, an embodiment of a manufacturing method of a solar cell 100 and a unit cell 100' of the solar cell is described. FIGS. 4A to 4G are cross-sectional views sequentially showing an embodiment of a manufacturing method of the solar cell 100 and the unit cell 100' of the solar cell.

Figure 4A:
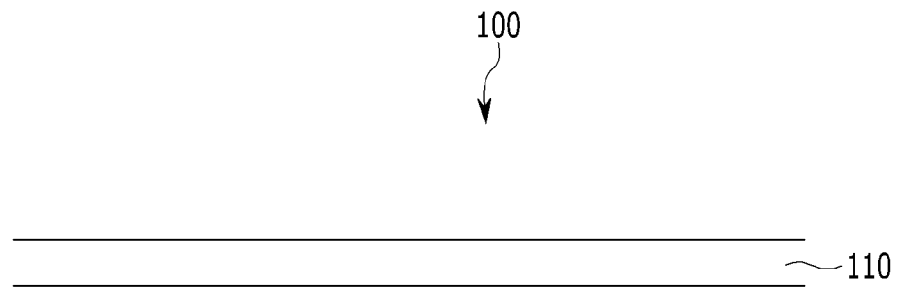
FIGS. 4A to 4G are cross-sectional views sequentially showing an embodiment of a manufacturing method of a solar cell and a unit cell of the solar cell.

First, referring to FIG. 4A, a semiconductor layer 110 is formed. Hereinafter, unless otherwise indicated, the semiconductor layer 110 is as described above.

Figure 4B:
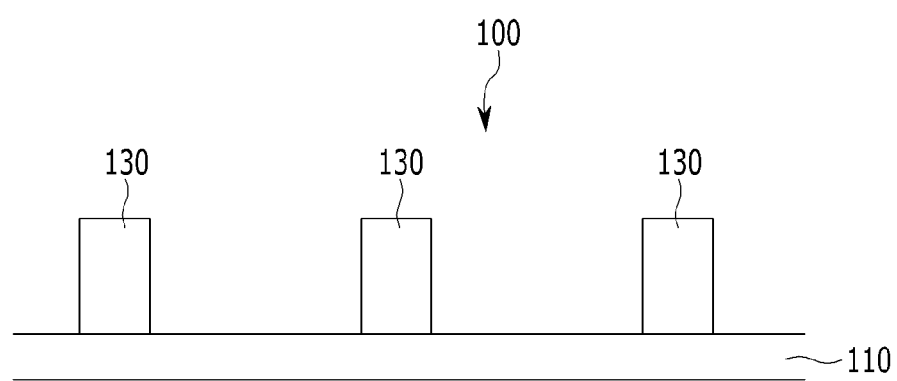

Next, referring to FIG. 4B, a plurality of patterned dielectric layers 130 is formed on a front side of the semiconductor layer 110. The formation of the plurality of patterned dielectric layers 130 is as described above.

Figure 4C:
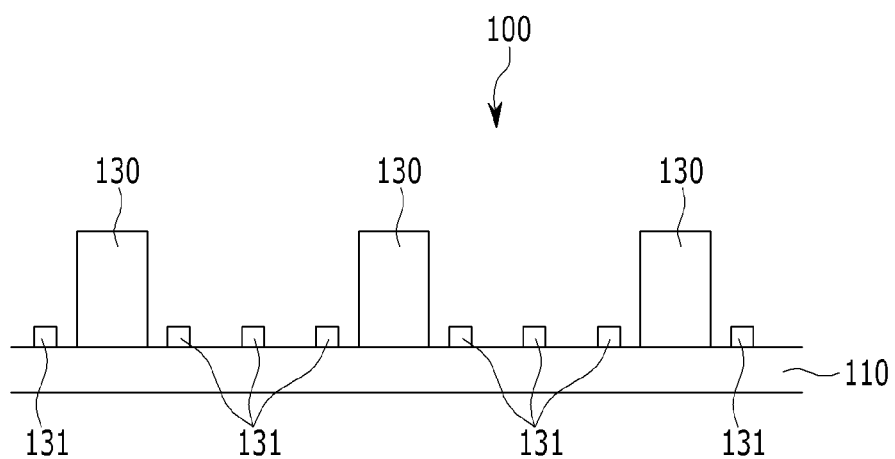

Next, referring to FIG. 4C, a plurality of auxiliary layers 131 distinguished from the dielectric layer 130 is formed on the front side of the semiconductor layer 110. The formation of the plurality of the patterned auxiliary layers 131 is as described in the formation of the patterned dielectric layer.

Although a process for forming the patterned auxiliary layer 131 is shown in FIG. 4C, in an embodiment, the process may be omitted.

Figure 4D:
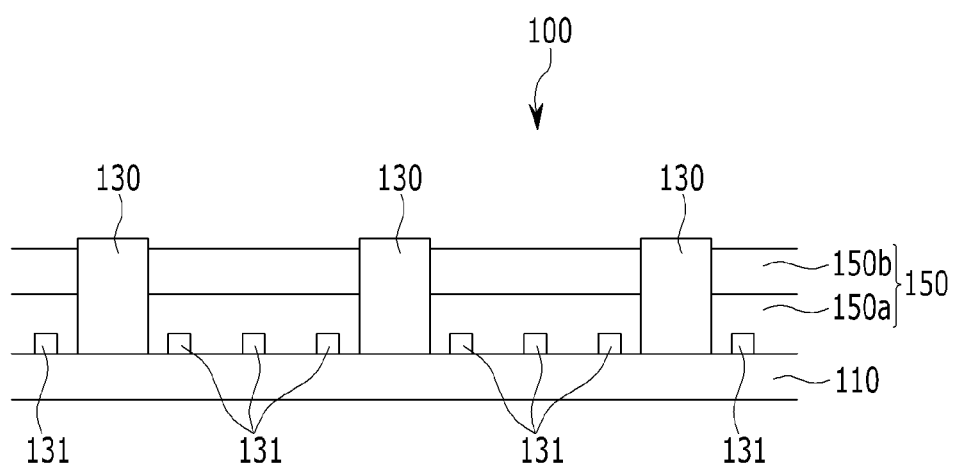

Next, referring to FIG. 4D, a photoactive layer 150 including a lower photoactive layer 150a and an upper photoactive layer 150b is formed between the dielectric layers 130 so as to cover the auxiliary layer 131. The formation of the photoactive layer 150 is as described above.

Figure 4E:
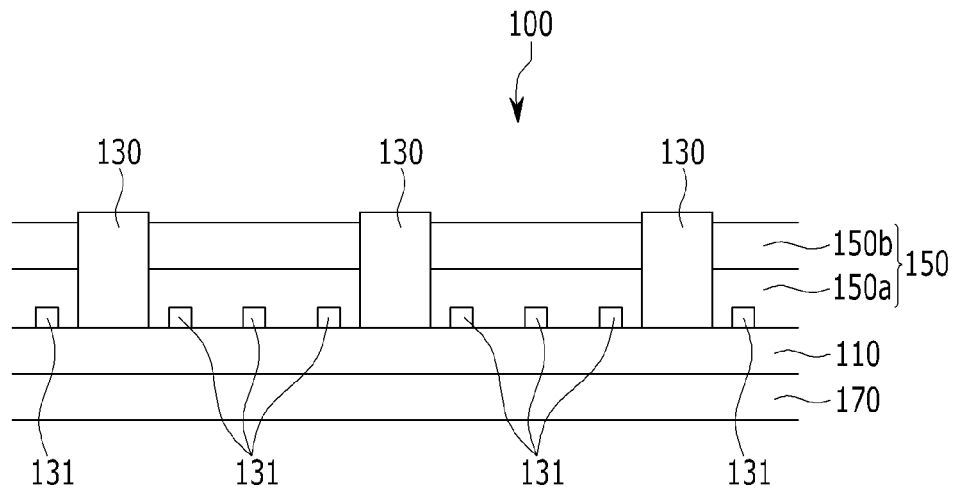

Next, referring to FIG. 4E, a rear electrode 170 is disposed on the rear side of the semiconductor layer 110. The rear electrode 170 may be manufactured using a material having excellent conductivity, such as silver (Ag), gold (Au), by sputtering, vacuum deposition or a combination thereof.

Figure 4F:
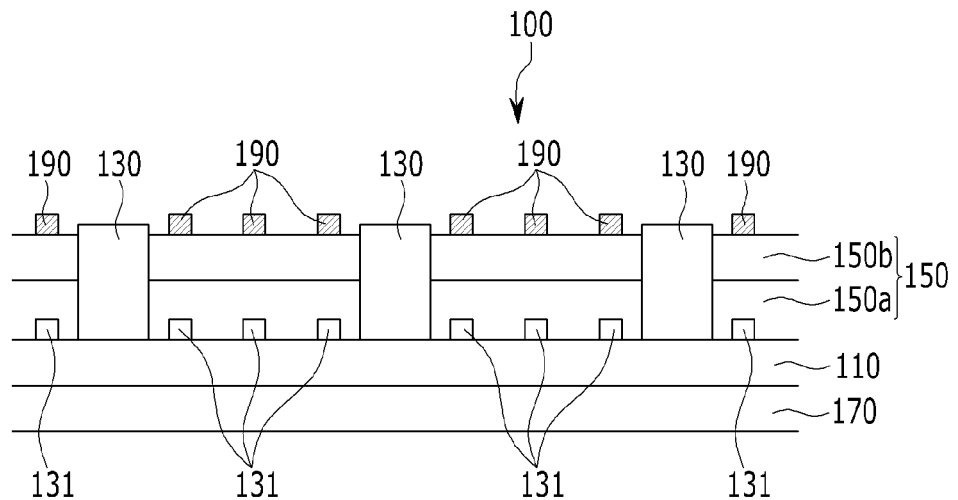

Next, referring to FIG. 4F, a front electrode 190 is disposed on a front side of the photoactive layer 150. The front electrode 190 may be manufactured using a material having excellent conductivity, such as Ag, Au, by screen-printing, inkjet printing, press printing or a combination thereof. In an embodiment, a plurality of the front electrodes 190 may be disposed so as to be separate from each other on the front side of the photoactive layer 150.

Figure 4G:
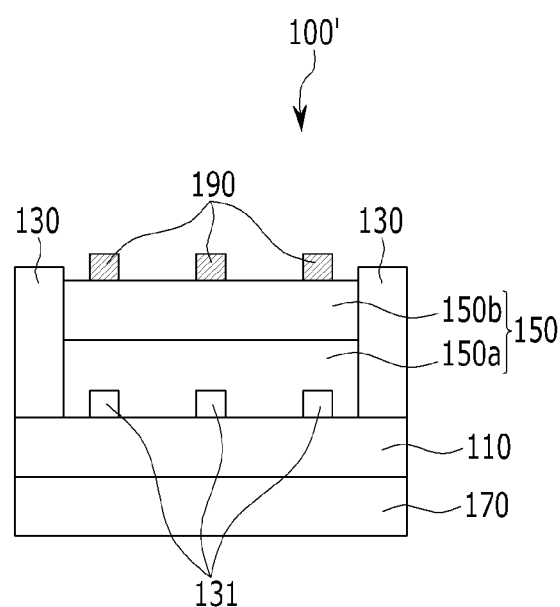

Next, referring to FIG. 4G, the solar cell may be separated into a unit cell 100' by cutting the dielectric layer 130, the semiconductor layer 110 and the rear electrode 170 along the vertical direction of the dielectric layer 130. To separate the solar cell 100 into a unit cell 100', a cutting method using a sawing machine may be used, but is not limited thereto. Since the solar cell 100 may be separated into the unit cell 100' without damaging the photoactive layer 150, a further sidewall etching process may not be required, thus simplifying the manufacturing process. Thereby, performance and economics of the manufacturing method of the solar cell 100 may be improved. Although a process for separating the solar cell 100 into the unit cell 100' is shown in FIG. 4G, in an embodiment, the process may be omitted.

Figure 5:
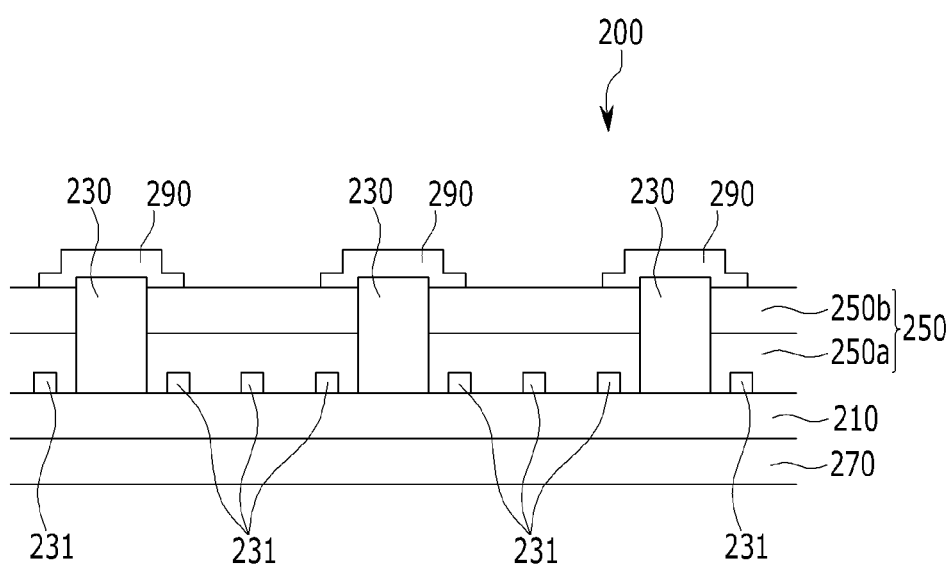
FIG. 5 is a cross-sectional view of another embodiment of a solar cell.

Referring to FIG. 5, an embodiment of a solar cell is described. FIG. 5 is a cross-sectional view of an embodiment of a solar cell.

A solar cell 200 includes a semiconductor layer 210. A plurality of dielectric layers 230 that are separated from each other is disposed on a front side of the semiconductor layer 210. A photoactive layer 250 including a lower photoactive layer 250a and an upper photoactive layer 250b is disposed between the dielectric layers 230. A front electrode 290 is disposed on the dielectric layer 230. A rear electrode 270 is disposed under the semiconductor layer 210. The solar cell 200 may further include at least one of auxiliary layers 231 formed on one side of the semiconductor layer 210, covered with the photoactive layer 250 and separated from each other.

Hereinafter, unless otherwise indicated, the semiconductor layer 210, the dielectric layer 231, the photoactive layer 250, the front electrode 290, the rear electrode 270 and the auxiliary layer 231 are as described above.

The distance between the dielectric layers 230 may be about 1 mm to about 10 mm. If the distance between the dielectric layers 230 is within the above range, then strain generation in the photoactive layer 250 may be effectively prevented or substantially relieved. In an embodiment, the distance between the dielectric layers 230 may be about 3 mm to about 10 mm. In an embodiment, the distance between the dielectric layers 230 may be about 5 mm to about 10 mm.

The dielectric layer 230 may have a width of about 1 µm to about 200 µm. If the width of the dielectric layer 230 is within the above range, then strain generation in the photoactive layer 250 may be effectively prevented or substantially relieved. Additionally, subsequently described generation of a dark current under the front electrode 290 may be effectively prevented or effectively decreased. In an embodiment, the dielectric layer 230 may have a width of about 1 µm to about 100 µm. In an embodiment, the dielectric layer 230 may have a width of about 5 µm to about 50 µm.

The front electrode 290 is disposed on the dielectric layer 230. The width of the front electrode 290 may be larger than the width of the dielectric layer 230. Thus, the generation of the dark current in the front electrode 290 may be suppressed to increase the open circuit voltage (Voc).

The solar cell 200 may further include at least one of auxiliary layers 231 disposed on one side of the semiconductor layer 210, covered with the photoactive layer 250 and separated from each other. Although the auxiliary layers 231 are shown in FIG. 4, in an embodiment, the solar cell 200 may not include the auxiliary layers 231.

Referring to FIGS. 6A to 6F together with FIG. 5, an embodiment of a manufacturing method of a solar cell 200 is described. FIGS. 6A to 6F are cross-sectional view sequentially showing an embodiment of a manufacturing method of the solar cell 200.

Figure 6A:
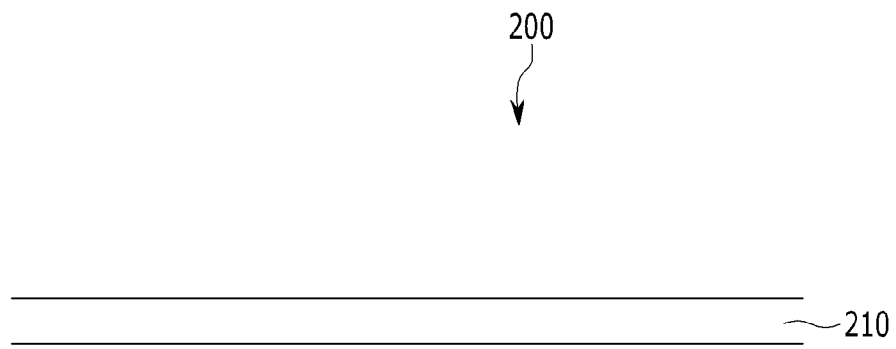
FIGS. 6A to 6F are cross-sectional views sequentially showing another embodiment of a manufacturing method of the solar cell.

First, referring to FIG. 6A, a semiconductor layer 210 is formed. Hereinafter, unless otherwise indicated, the semiconductor layer 210 is as described above.

Figure 6B:
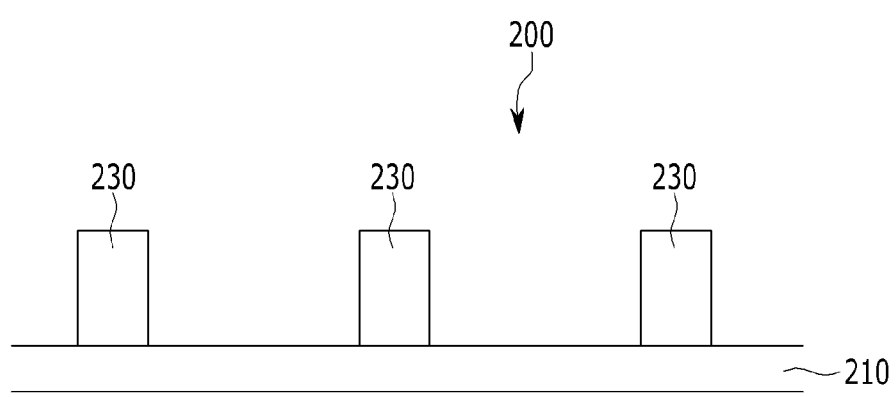

Next, referring to FIG. 6B, a plurality of patterned dielectric layers 230 is formed on the front side of the semiconductor layer 210. The formation of the patterned dielectric layers 230 is as described above.

Figure 6C:
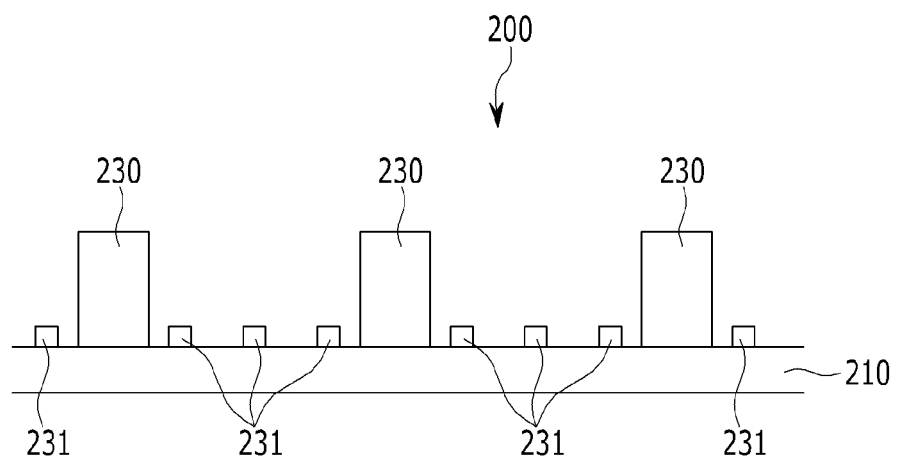

Next, referring to FIG. 6C, a patterned auxiliary layer 231, distinguished from the dielectric layer 230, is formed on the front side of the semiconductor layer 210. The formation of the patterned auxiliary layer 231 is as described above. Although a process for forming the patterned auxiliary layer 231 is shown in FIG. 6C, in an embodiment, the process may be omitted.

Figure 6D:
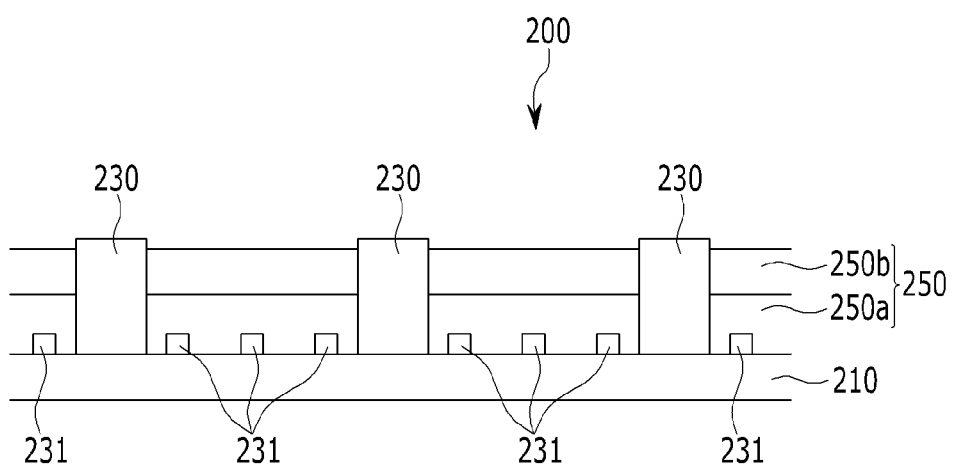
Figure 6E:
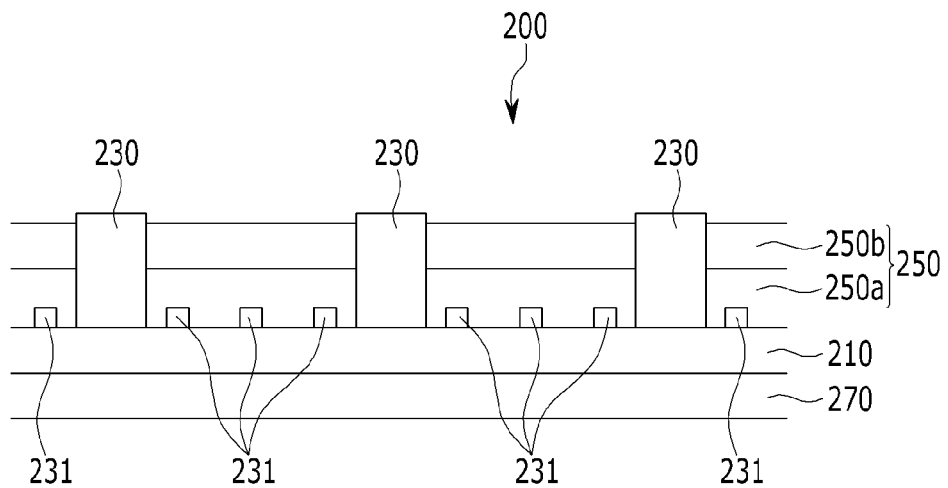

Next, referring to FIG. 6D, a photoactive layer 250 is formed between the dielectric layers 230 separated from each other so as to cover the auxiliary layer 231. The formation of the photoactive layer 250 is as described above. Next, referring to FIG. 6E, a rear electrode 270 is disposed on the rear side of the semiconductor layer 210. The disposition of the rear electrode 270 is as described above.

Figure 6F:
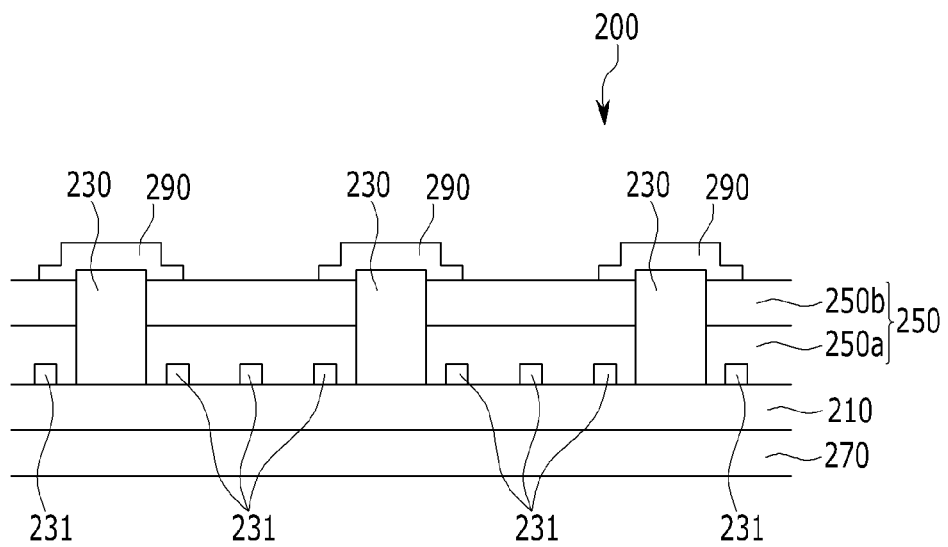

Next, referring to FIG. 6F, a front electrode 290 is disposed on the front side of the dielectric layer 230. The structure of the front electrode 290 may be such that width of the front electrode 290 may be larger than the width of the dielectric layer 230.

The disposition of the front electrode 290 is as described above.

As described, if the plurality of dielectric layers 230 are disposed on the front side of the semiconductor layer 210 and then the photoactive layer 250 is formed between the dielectric layers 230, then defect and strain generation in the photoactive layer 250 may be effectively prevented or substantially relieved.

While this disclosure has been described in connection with what is presently considered to be practical embodiments, a skilled artisan understands that the invention is not limited to the disclosed embodiments, but, on the contrary, is intended to cover various modifications and equivalent arrangements included within the spirit and scope of the appended claims.

What is claimed is:
1. A substrate comprising:
  a semiconductor layer;
  a plurality of dielectric layers disposed on one side of the semiconductor layer, which defines a plurality of unit cells;
  a plurality of auxiliary layers disposed on the one side of the semiconductor layer; and
  a photoactive layer disposed between the dielectric layers, covering the plurality of auxiliary layers and comprising a compound of a Group III element and a Group V element,
  wherein each unit cell includes an auxiliary layer of the plurality of auxiliary layers, and a thickness of each auxiliary layer of the plurality of auxiliary layers is less than a thickness of each dielectric layer of the plurality of dielectric layers.

2. The substrate of claim 1, wherein the semiconductor layer comprises at least one of Si, Ge and a combination thereof.

3. The substrate of claim 2, wherein the semiconductor layer comprises Si.

4. The substrate of claim 1, wherein the each dielectric layer comprises at least one of an oxide, a nitride, an oxynitride, and a combination thereof, and the oxide comprises at least one of aluminum oxide ($Al_2O_3$), silicon oxide ($SiO_x$), titanium oxide ($TiO_2$ or $TiO_4$), and a combination thereof, the nitride comprises at least one of aluminum nitride (AlN), silicon nitride ($SiN_x$), titanium nitride (TiN), and a combination thereof, and the oxynitride comprises at least one of aluminum oxynitride (AlON), silicon oxynitride (SiON), titanium oxynitride (TiON), and a combination thereof.

5. The substrate of claim 1, wherein a distance between two adjacent dielectric layers of the plurality of dielectric layers is from about 1 millimeter to about 10 millimeters.

6. The substrate of claim 1, wherein the thickness of the each dielectric layer is from about 1 micrometer to about 20 micrometers.

7. The substrate of claim 1, wherein a width of the each dielectric layer is from about 1 micrometer to about 200 micrometers.

8. The substrate of claim 1, wherein the Group III element comprises at least one of B, Al, Ga, In, Tl and a combination thereof.

9. The substrate of claim 1, wherein the Group V element comprises at least one of N, P, As, Sb, Bi and a combination thereof.

10. The substrate of claim 1, wherein a thickness of the photoactive layer is equal to or less than the thickness of the each dielectric layer.

11. The substrate of claim 1, wherein the each auxiliary layer comprises at least one of an oxide, a nitride, an oxynitride, or a combination thereof, and the oxide comprises at least one of aluminum oxide ($Al_2O_3$), silicon oxide ($SiO_x$), titanium oxide ($TiO_2$ or $TiO_4$), or a combination thereof, the nitride comprises at least one of aluminum nitride (AlN), silicon nitride ($SiN_x$), titanium nitride (TiN), or a combination thereof, and the oxynitride comprises at least one of aluminum oxynitride (AlON), silicon oxynitride (SiON), titanium oxynitride (TiON), or a combination thereof.

12. The substrate of claim 1, the each unit cell comprises two or more auxiliary layers which are separated from each other, wherein a distance between two adjacent auxiliary layers of the two or more auxiliary layers is from about 10 nanometers to about 1 micrometer.

13. The substrate of claim 1, wherein the thickness of the each auxiliary layer is from about 1 nanometer to about 100 nanometers.

14. The substrate of claim 1, wherein a width of the each auxiliary layer is from about 1 nanometer to about 100 nanometers.

15. A solar cell comprising:
a semiconductor layer;
a plurality of dielectric layers disposed on one side of the semiconductor layer, which defines a plurality of unit cells;
a plurality of auxiliary layers disposed on the one side of the semiconductor layer; and
a photoactive layer disposed between the dielectric layers, covering the plurality of auxiliary layers and comprising a compound of a Group III element and a Group V element;
a first electrode electrically connected to the semiconductor layer; and
a second electrode electrically connected to the photoactive layer,
wherein
each unit cell includes an auxiliary layer of the plurality of auxiliary layers, and
a thickness of each auxiliary layer of the plurality of auxiliary layers is less than a thickness of each dielectric layer of the plurality of dielectric layers.

16. The solar cell of claim 15, wherein the semiconductor layer comprises at least one of Si, Ge and a combination thereof.

17. The solar cell of claim 16, wherein the semiconductor layer comprises Si.

18. The solar cell of claim 15, wherein the each dielectric layer comprises at least one of an oxide, a nitride, an oxynitride, and a combination thereof, and the oxide comprises at least one of aluminum oxide ($Al_2O_3$), silicon oxide ($SiO_x$), titanium oxide ($TiO_2$ or $TiO_4$), and a combination thereof, the nitride comprises at least one of aluminum nitride (AlN), silicon nitride ($SiN_x$), titanium nitride (TiN), and a combination thereof, and the oxynitride comprises at least one of aluminum oxynitride (AlON), silicon oxynitride (SiON), titanium oxynitride (TiON), and a combination thereof.

19. The solar cell of claim 15, wherein a distance between two adjacent dielectric layers of the plurality of dielectric layers is from about 1 millimeter to about 10 millimeters.

20. The solar cell of claim 15, wherein the thickness of the each dielectric layer is from about 1 micrometer to about 20 micrometers.

21. The solar cell of claim 15, wherein a width of the each dielectric layer is from about 1 micrometer to about 200 micrometers.

22. The solar cell of claim 15, wherein the Group III element comprises at least one of B, Al, Ga, In, Tl and a combination thereof.

23. The solar cell of claim 15, wherein the Group V element comprises at least one of N, P, As, Sb, Bi and a combination thereof.

24. The solar cell of claim 15, wherein a thickness of the photoactive layer is equal to or less than the thickness of the each dielectric layer.

25. The solar cell of claim 15, wherein the second electrode is disposed on one side of the each dielectric layer, on one side of the photoactive layer, or on both.

26. The solar cell of claim 25, wherein a width of the second electrode is larger than a width of the each dielectric layer s when the second electrode is disposed on the one side of the each dielectric layer.

27. The solar cell of claim 15, wherein the each auxiliary layer comprises at least one of an oxide, a nitride, an oxynitride, and a combination thereof, and the oxide comprises at least one of aluminum oxide ($Al_2O_3$), silicon oxide ($SiO_x$), titanium oxide ($TiO_2$ or $TiO_4$), and a combination thereof, the nitride comprises at least one of aluminum nitride (AlN), silicon nitride ($SiN_x$), titanium nitride (TiN), and a combination thereof, and the oxynitride comprises at least one of aluminum oxynitride (AlON), silicon oxynitride (SiON), titanium oxynitride (TiON), and a combination thereof.

28. The solar cell of claim 15, each the unit cell comprises two or more auxiliary layers separated from each other, wherein a distance between two adjacent auxiliary layers of the two or more auxiliary layers is from about 10 nanometers to about 1 micrometer, and the thickness of the each auxiliary layer is from about 1 nanometer to about 100 nanometers, and a width of the each auxiliary layer is from about 1 nanometer to about 100 nanometers.

* * * * *